United States Patent [19]

Sterzer

[11] Patent Number: 5,357,224
[45] Date of Patent: Oct. 18, 1994

[54] CONTINUOUSLY-VARIABLE MONOLITHIC RF AND MICROWAVE ANALOG DELAY LINES

[75] Inventor: Fred Sterzer, Princeton, N.J.

[73] Assignee: MMTC, Inc., Princeton, N.J.

[21] Appl. No.: 102,206

[22] Filed: Aug. 5, 1993

[51] Int. Cl.$^5$ ............................................. H03H 7/20
[52] U.S. Cl. .................................. 333/139; 333/164; 333/166; 307/606
[58] Field of Search .................................. 33/138–140, 33/156, 164, 165, 166; 307/511, 594, 605, 606, 595; 257/365

[56] References Cited

U.S. PATENT DOCUMENTS

| 4,156,876 | 5/1979 | Debuisser | 333/166 X |
| 4,511,813 | 4/1985 | Pan | 333/164 X |
| 5,168,250 | 12/1992 | Bingham | 333/164 X |

Primary Examiner—Seungsook Ham
Attorney, Agent, or Firm—George J. Seligsohn

[57] ABSTRACT

The use of one or more multi-gate (e.g., dual-gate) FETs are employed in an RF or microwave delay line. The carrier drift velocity in each multi-gate FET is controlled in accordance with the variable magnitude of a delay-control voltage applied between its drain and source, thereby controlling the time delay experienced by an RF or microwave signal traveling between spaced first and second gates of a multi-gate FET. The gates of a plurality of multi-gate FETs may be serially-coupled through amplifying circuits to produce a delay chain in which the total delay is the sum of the delays of all the multi-gate FETs in the chain. A single delay-control voltage, which can be continuously variable, may be used to control the total delay provided by all multi-gate FETs in the chain. Alternatively, a separate delay-control voltage, which can be independently continuously variable, may be used for independently controlling the delay provided by each individual multi-gate FET in the chain. RF and microwave analog delay lines are useful in such apparatus as difference-in-time-of-arrival direction finders and transversal filters, by way of example.

14 Claims, 6 Drawing Sheets

CONTINUOUSLY-VARIABLE MONOLITHIC RF AND MICROWAVE ANALOG DELAY LINES

This invention was made with Government support and Government has certain rights to this invention.

BACKGROUND OF THE INVENTION

1. Field of the Invention

This invention relates to continuously-variable monolithic radio-frequency (RF) and microwave analog delay lines and their use in analog devices employing these analog delay lines, such as direction finders and transversal filters by way of examples.

2. Description of the Prior Art

Digital signal-processing techniques are well known in the art, and are employed, inter alia, for implementing delay-line circuits (e.g. shift registers), transversal filters, Fast Fourier transforms (FFT), autocorrelation analyses, etc. Up to medium radio frequencies, it is feasible to sample and digitize signals at precisely spaced times. However, at high radio and microwave frequencies, digitizing analog input signals is not yet practical. Therefore, equivalent analog signal-processing techniques may be performed at high radio and microwave frequencies using sequential time delay elements in conjunction with suitable microwave combinational elements or circuits. However, it should be understood that while from a physical point of view the signals processed by such sequential time delay elements are analog signals, from an informational point of view the signals may be comprised of a sequence of digitally (e.g., binary) coded pulses that are not precisely spaced rather than being comprised of continuous signals. Examples of known time delay elements for implementing such analog signal-processing include surface-acoustic-wave (SAW) devices and acoustic-charge-transport (ACT) devices.

Also known in the microwave and radio frequency analog art is a dual-gate field-effect transistor (FET). An example of such a dual-gate (FET) is a dual-gate GaAs MESFET, manufactured by NEC and designated NE 25139, which heretofore has been used as an RF amplifier and as a mixer in UHF applications.

Further known is that carriers in a semiconductor material subject to an applied electric field drift at a drift velocity that is a function of both the particular type of semiconductor material and the strength of the applied electric field.

SUMMARY OF THE INVENTION

In accordance with the principles of the present invention it has been found that a multi-gate field-effect FET is suitable for use as a voltage-controlled analog delay line (VCD) functioning at RF or microwave frequencies. By way of example, a VCD is useful as an element in a signal-processing device such as a direction finder or a transversal filter. An analog element such as a VCD is generally equivalent to a variable clock rate for signal processing.

More specifically, the present invention is directed to a voltage-controlled delay line comprising a multi-gate field-effect transistor (FET) composed primarily of a given material, in which the multi-gate FET includes a source at one end thereof and a drain at the other end thereof, and two or more gates comprising a first gate spaced from both said the source and the drain and situated in between them, and a second gate situated in between the first gate and the drain and spaced a given distance from the first gate. One of the first and second gates is adapted to have an input signal applied thereto and the other of the first and second gates is adapted to have an output signal extracted therefrom. The voltage-controlled delay line further comprises a voltage-supply means for applying a given voltage between the source and the drain of the dual-gate FET. The result is that the output signal is time delayed with respect to the input signal by an amount determined by (1) the given material, (2) the given distance, and (3) the magnitude of the given voltage. The time delay can be continuously varied merely by continuously varying the magnitude of the given voltage.

DESCRIPTION OF PREFERRED EMBODIMENTS OF THE INVENTION

Figure 1:
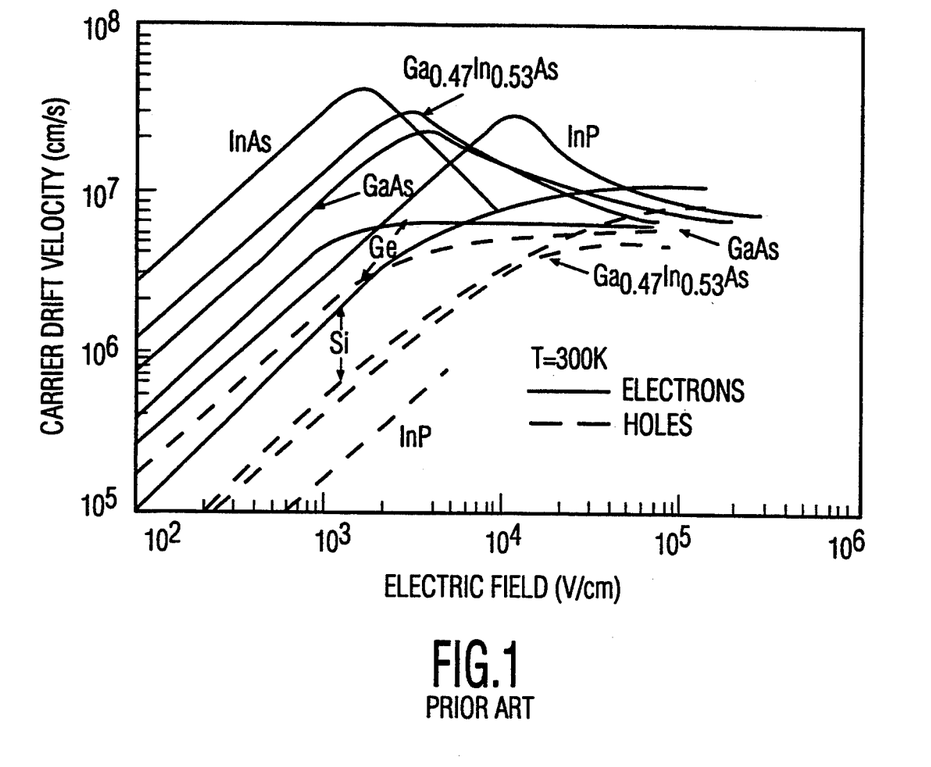
FIG. 1 illustrates the hole and/or electron carrier-drift velocity-electric field characteristics of several heavily used semiconductors, as known in the prior art.

Reference is made to FIG. 1, which shows the hole and/or electron carrier-drift velocity-electric field characteristics of several heavily used semiconductors (including GaAs and silicon). It is apparent from FIG. 1 that each of the hole and electron carrier-drift velocity of a semiconductor material is a substantially linear function of electric-field intensity up to a given threshold which depends on the particular semiconductor material. The present invention takes advantage of this linear relationship for varying delay time in accordance with the magnitude of the electric intensity applied to a dual-gate FET primarily composed of a particular one of the semiconductor materials shown in FIG. 1.

Figure 2:
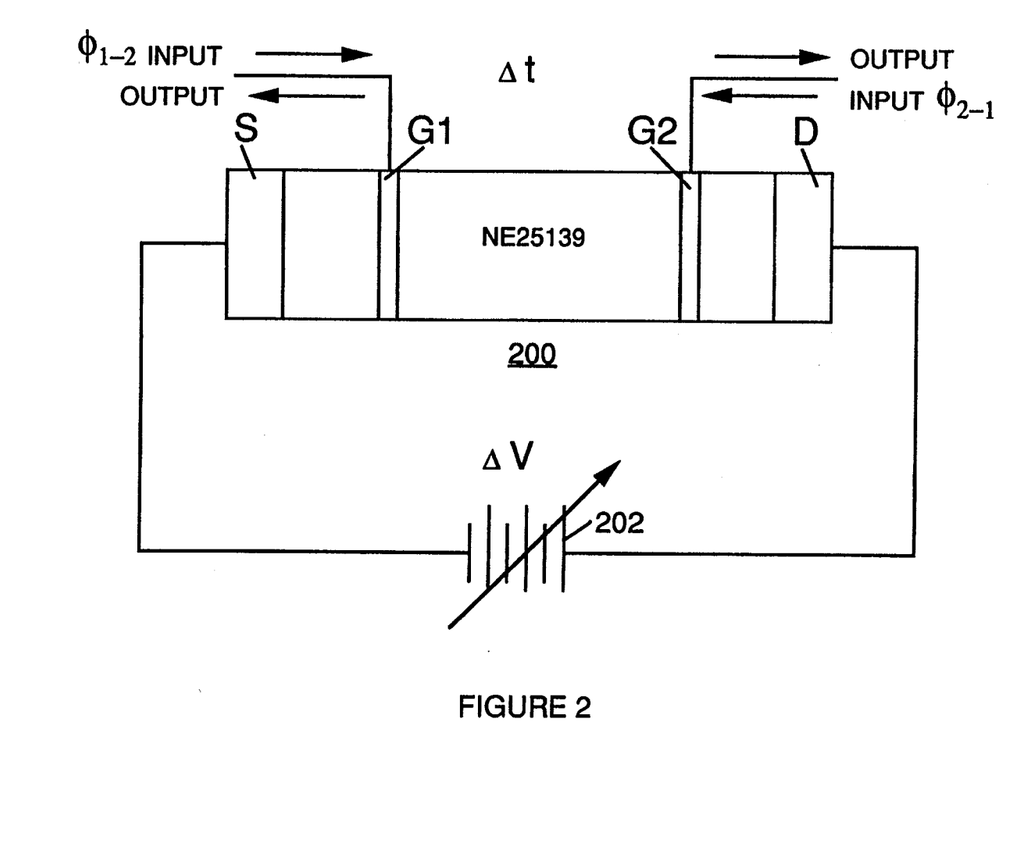
FIG. 2 illustrates a dual-gate FET variable delay circuit element employing the principles of the present invention.

Reference is now made to FIG. 2, which shows a dual-gate FET variable delay element. While the dual-gate FET employed in FIG. 2 could be primarily composed of any particular one of the semiconductor materials shown in FIG. 1, it is assumed for the purpose of description that the dual-gate FET is the aforesaid prior-art dual-gate GaAs MESFET NE 25139, manufactured by NEC.

As indicated in FIG. 2, element 200 (e.g., NE 25139), comprising primarily a given material (e.g., GaAs), is a field-effect transistor (FET) that includes a source S at one end of the length thereof and a drain D at the other end of the length thereof. A first gate G1, spaced respective distances from both source S and drain D, is situated in between them, while a second gate G2, spaced respective distances from both first gate G1 and drain D, is situated in between them. An adjustable voltage supply 202 connected between drain D and source S is capable of controlling the positive value of the difference in potential ΔV of drain D with respect to source S. A radio-frequency or microwave input signal $\Phi_{1\text{-}2}$ may be applied to first gate G1 and an output signal derived therefrom extracted from second gate G2, or, alternatively, a radio-frequency or microwave input signal $\Phi_{2\text{-}1}$ may be applied to second gate G2 and an output signal derived therefrom extracted from first gate G1.

The above-described dual-gate FET variable delay circuit element of FIG. 2 operates in a manner similar to a traveling-wave tube. As carriers drift from source S to drain D, at a velocity determined by both the material of which dual-gate FET is composed and the value of the potential difference $\Delta V$ (see FIG. 1), they pass each of gates G1 and G2. In the first case, where the input signal is $\Phi_{1\text{-}2}$, a forward wave is launched by the input signal at first gate G1 which modulates the carrier drift velocity in accordance therewith, and, after a certain time delay determined by the modulated carrier drift velocity, a corresponding output signal is induced in second gate G2. Similarly, in the second case, where the input signal is $\Phi_{2\text{-}1}$, a backward wave is launched by the input signal at second gate G2 which modulates the carrier drift velocity in accordance therewith, and, after a certain time delay determined by the modulated carrier drift velocity, a corresponding output signal is induced in first gate G1. It is apparent that the difference in phase between that of the induced output radio-frequency or microwave signal and that of the induced output radio-frequency or microwave signal corresponds to the value of this certain time delay.

Figure 3:
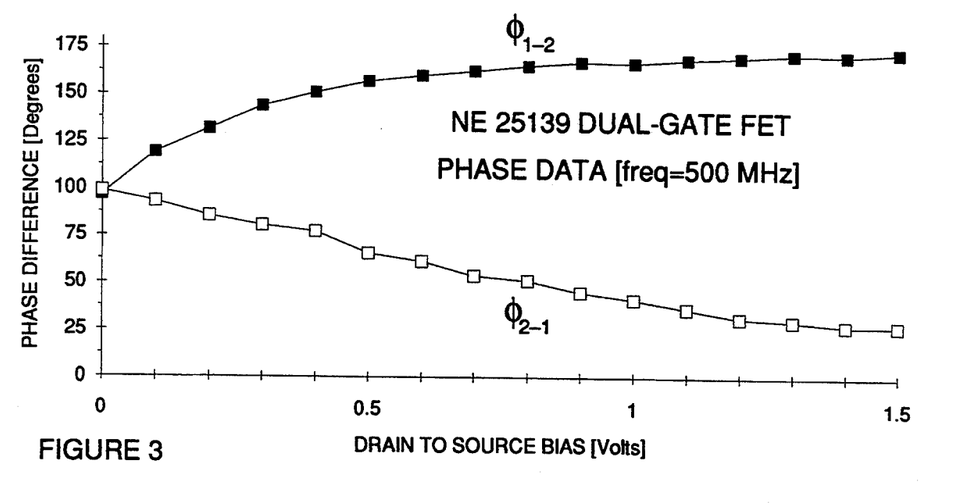
FIG. 3 is a graph helpful in explaining the operation of the dual-gate FET variable delay element shown in FIG. 2.

Reference is now made to FIG. 3, which is a chart of experimental phase data showing the relationship of the value of phase difference (in degrees) as a function of drain to source bias $\Delta V$ (in volts) of the NE 25139 dual-gate FET for a 500 MHz $\Phi_{1\text{-}2}$ input signal and for a 500 MHz $\Phi_{2\text{-}1}$ input signal. Thus, by controlling the value $\Delta V$ of variable voltage supply 202, the phase difference, and hence the time delay, between the output and input signals can be continuously varied to any desired value within an extended range of values, such as, by way of an example, the 500 MHz phase-difference range of values for the NE 25139 dual-gate FET shown in FIG. 3.

Figure 4:
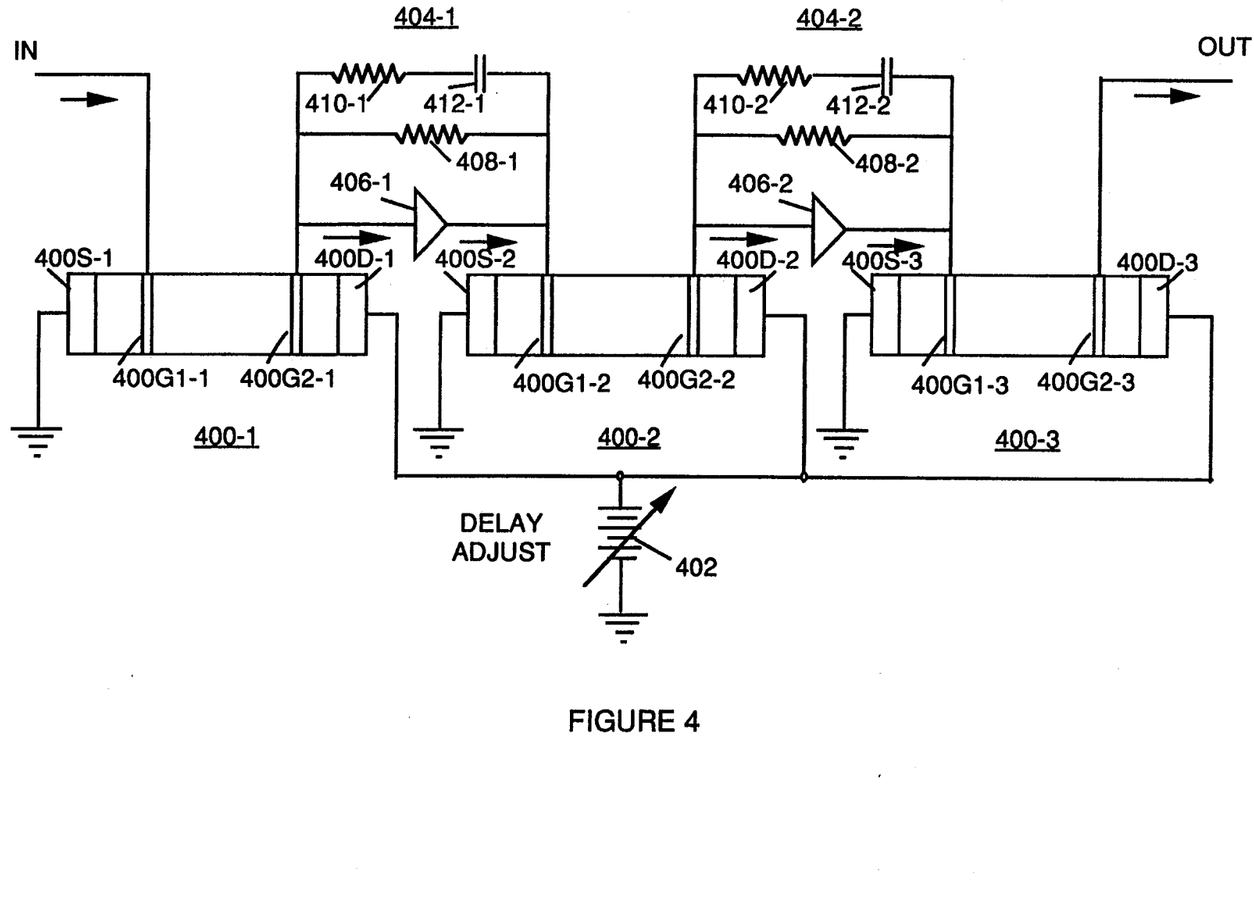
FIG. 4 illustrates a dual-gate FET variable delay chain, which, inter alia, is useful in a difference-in-time-of arrival (DTOA) direction finder.

The dual-gate FET variable delay circuit element of FIG. 2 is particularly suitable for use as a component of any analog device operating at a radio frequency or a microwave frequency that requires one or more controllable time delays for its proper operation. In this regard, FIG. 4, shows an example of a dual-gate FET variable delay chain comprising three dual-gate FETs 400-1, 400-2 and 400-3, each of which is similar in structure and function to dual-gate FET 200 of above-described FIG. 2.

More specifically, dual-gate FET 400-1 comprises source 400S-1, first gate 400G 1-1, second gate 400G2-1 and drain 400D-1; dual-gate FET 400-2 comprises source 400S-2, first gate 400G1-2, second gate 400G2-2 and drain 400D-2, and dual-gate FET 400-3 comprises source 400S-3, first gate 400G1-3, second gate 400G2-3 and drain 400D-3. A single delay-adjust variable voltage source 402 is applied in parallel between the drain and source of all three of these dual-gate FETs 400-1, 400-2 and 400-3. An RF or microwave signal is applied as an input to first gate 400G 1-1 of dual-gate FET 400-1 and an output at second gate 400G2-1 of dual-gate FET 400-1 is coupled as an input to first gate 400G1-2 of dual-gate FET 400-2 through wide-band amplifying circuit 404-1, which comprises amplifier 406-1 (which may be an integrated MMIC amplifier) bypassed by a filter made up of resistance 408-1, resistance 410-1 and capacitance 412-1). Similarly, an output at second gate 400G2-2 of dual-gate FET 400-2 is coupled as an input to first gate 400G1-3 of dual-gate FET 400-3 through wide-band amplifying circuit 404-2. The output from the dual-gate FET variable delay chain shown in FIG. 4 is derived at second gate 400G2-3 of dual-gate FET 400-3.

Each of dual-gate FETs 400-1, 400-2 and 400-3 individually produces a time delay between the signal applied to its first gate and the arrival of this signal at its second gate having a value determined by the drift velocity of the carriers therebetween. This drift velocity, in turn, depends on the setting of delay-adjust variable voltage source 402. However, because of the serial coupling through wide-band amplifying circuits 404-1 and 404-2, the respective individual time delays produced by each of dual-gate FETs 400-1, 400-2 and 400-3 is additive. Thus, the total time delay produced by the dual-gate FET variable delay chain shown in FIG. 4 is three times the time delay produced by each individual one of dual-gate FETs 400-1, 400-2 and 400-3 (plus any slight time delay produced by amplifying circuits 404-1 and 404-2). It is obvious that this time delay can be further increased by employing a dual-gate FET variable delay chain comprising more than three dual-gate FETs.

Each dual gate FET introduces an insertion loss in the signal traveling therethrough between its first and second gates. Amplifying circuits, such as amplifying circuits 404-1 and 404-2, make up for such insertion losses. The RC filter of each amplifying circuit is used to maintain the desired wide frequency passband characteristic of the dual-gate FET variable delay chain.

The type of dual-gate FET variable delay chain exemplified in FIG. 4 is suitable for providing improved precision in a difference-in-time-of-arrival (DTOA) direction finder. In particular, the use of continuously variable delay lines settable to exactly match time received signal time offsets. For a pointing accuracy of ±0.1°, differential time delays of ±6.7 picoseconds are required for antenna base lines of 1 meter. With conventional switched delay lines, such precision differential delays are difficult to achieve. Semiconductor monolithic delay lines, on the other hand, can be used in such high-accuracy DTOA direction finders because, their delays can be continuously varied and they can be readily cascaded (as shown in above-discussed FIG. 4 into a chain of delay elements and integrated with MMIC amplifiers whose gain compensates for losses in the delay elements. Such delay lines combine high precision, low loss, continuous controlled delay, extremely small size, wide bandwidth, and an inherent capability to operate at microwave as well as lower radio frequencies.

Figure 5:
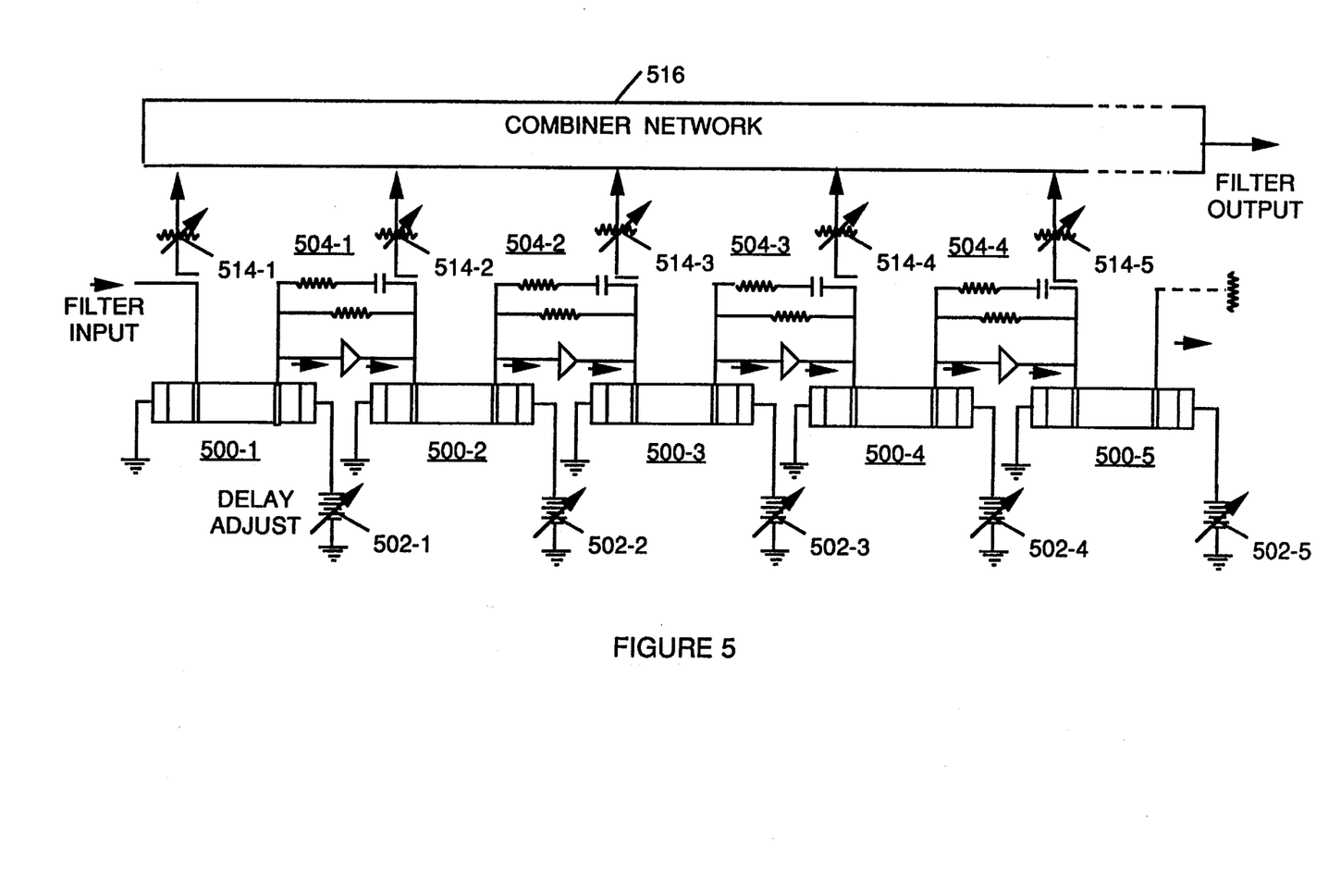
FIG. 5 illustrates a dual-gate FET variable delay chain useful in a transversal filter.

Another example of an analog device employing a dual-gate FET variable delay chain is the transversal filter shown in FIG. 5. Specifically, FIG. 5 illustrates a multitap transversal filter for an RF or microwave signal (only the first five taps of which are shown in detail) that employs a dual-gate FET variable delay chain generally similar to that of above-described FIG. 4. A filter input is applied to the first gate of dual-gate FET 500-1; the second gate of dual-gate FETs 500-1, 500-2, 500-3, 500-4, . . . , respectively, are coupled to the first gate of dual-gate FETs 500-2, 500-3, 500-4, 5005, . . . through respective amplifying circuits 504-1, 504-2, 504-3, 504-4, . . . (each of which is similar to above-described amplifying circuits 404-1 and 404-2).

A portion of the RF or microwave signal appearing at the first gates of respective dual-gate FETs 500-1, 500-2, 500-3, 500-4, 500-5, . . . is coupled through a corresponding one of variable weighting factor attenuators 514-1, 514-2, 514-3, 514-4, 514-5 . . . to a separate input of combining network 516. Combining network 516 derives a filter output proportional to the sum of the separate inputs thereto.

As shown in FIG. 5, a separate delay-adjust variable voltage source 502-1, 502-2, 502-3, 502-4, 502-5 . . . is applied between the drain and source of its corresponding one of dual-gate FETs 500-1, 500-2, 500-3, 500-4, 500-5, . . . . This differs from that shown in FIG. 4, wherein a single delay-adjust variable voltage source 402 is applied in parallel between the drain and source of all three dual-gate FETs 400-1, 400-2 and 400-3.

The use of a separate delay-adjust variable voltage source 502-1, 502-2, 502-3, 502-4, 502-5 . . . permits independent control of the relative timing of each of the the RF or microwave signals respectively applied to each of the separate inputs of combiner network 516, while the use of a separate variable weighting factor attenuators 514-1, 514-2, 514-3, 514-4, 514-5 . . . permits independent control of the relative amplitude of each of the the RF or microwave signals respectively applied to each of the separate inputs of combiner network 516. Thus, the filter characteristic of the transversal filter shown in FIG. 5 can be precisely controlled to achieve a predetermined design characteristic.

Figure 6:
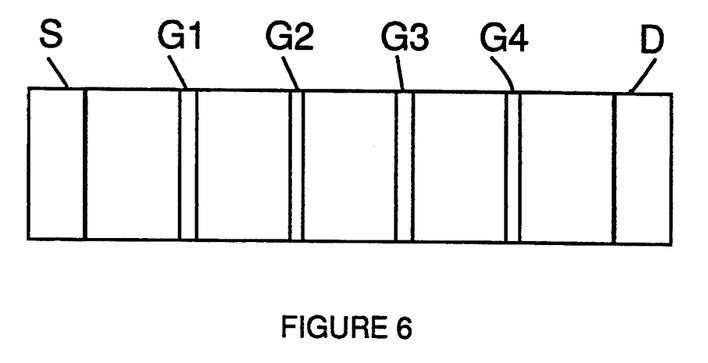
FIG. 6 illustrates a multi-gate FET comprising more than two gates.

For illustrative purposes, the multi-gate FETs shown in the above-described respective structures of FIGS. 2, 4 and 5 employ dual-gate FETs. However, as exemplified in FIG. 6, the present invention envisions the use of multi-gate FETs comprising more than two spaced gates. While the multi-gate FET specifically shown in FIG. 6 comprises four equally-spaced gates, more generally the multi-gate FETs that may be employed in providing continuously-variable, voltage-controlled delay (VCD) of RF or microwave signals may have a smaller or a greater number of gates that may be either equally or non-equally spaced from one another. A multi-gate FET comprising more than two spaced gates is suitable for use as a tapped delay line.

Apparatus electronically providing VCD of RF or microwave signals, which can be fabricated in compact monolithic form and employs the principles of the present invention described above, besides being useful in DTOA, transversal filter applications, and tapped delay lines, is also useful in improving the performance of a variety of other systems, including, inter alia, communications systems, phased-array systems, ELINT, ECM, radars, microwave imaging systems and high-speed computers.

For instance, in phased array antenna applications, numerous expensive phase shift elements and controllers are required to steer the antenna by complex phasing of the individual elements as a function of the transmission or reception frequency. The use of time delays in place of phase shifts simplifies the beam steering because time delay is independent of frequency. Continuously variable monolithic delay elements of the type described herein greatly simplify the operation of complex phased array systems and, where large numbers of elements are required, substantially reduce the overall cost of the system.

In deceptive electronic countermeasures applications, extremely complex systems are employed to retransmit false echoes after precise time delays in a controlled program to pull the enemy tracking radar away from the echo source to protect itself. The entire system of trying to memorize the incoming threat frequency and repeat it at a precise varying time could be greatly simplified if a true continuous variable delay were available. The monolithic semiconductor delay line described herein serves this function eminently well. Since it is a directly controllable delay, minimal additional circuitry is required and it operates against multiple simultaneous threats which most existing systems cannot do well.

Another application for the VCDs disclosed herein is in the design of high-speed computers where it is difficult to keep the timing properly in step throughout the various processor circuits. The VCDs might be built into critical signal paths and automatically adjusted to the delay needed to obtain proper time alignment of the data and clock signals. This would eliminate the need to slow the clock rate in order to preserve time alignment in the processors.

What is claimed is:

1. A voltage-controlled delay line comprising:

a multi-gate field-effect transistor (FET) composed primarily of a given material; wherein said multi-gate FET includes a source at one end thereof and a drain at the other end thereof, a first gate spaced from both said source and said drain and situated in between them, and a second gate situated in between said first gate and said drain and spaced a given distance from said first gate;

means for applying an input signal to one of said first and second gates and for extracting an output signal from the other of said first and second gates; and delay-control means for applying a delay-control voltage between said source and said drain of said dual-gate FET to effect a time delay of said output signal with respect to said input signal by an amount determined by (1) said given material, (2) said given distance, and (3) the magnitude of said delay-control voltage.

2. The voltage-controlled delay line defined in claim 1, wherein:

said delay-control means includes means for applying a delay-control voltage between said source and said drain of said multi-gate FET which is continuously variable in its magnitude;

whereby said time delay between said output signal and said input signal is continuously variable.

3. The voltage-controlled delay line defined in claim 1, wherein:

said multi-gate FET is a dual-gate FET.

4. The voltage-controlled delay line defined in claim 1, wherein:

said multi-gate FET comprises an additional gate located between said source and drain which is spaced from said source, said drain, said first gate and said second gate by each of separate specified distances.

5. The voltage-controlled delay line defined in claim 1, wherein:

said multi-gate FET comprises a plurality of additional gates located between said source and drain which are spaced from said source, said drain, said first gate, said second gate and one another by each of separate specified distances.

6. Apparatus comprising a delay chain for delaying an applied RF or microwave signal; said chain including:

a plurality of dual-gate field-effect transistors (FETs), with each of said dual-gate FETs in said chain (1) being composed primarily of a given material, and (2) comprising a source at one end thereof and a drain at the other end thereof, a first gate spaced from both said source and said drain thereof and situated in between them, and a second gate situated in between said first gate and said drain thereof and spaced a given distance from said first gate thereof;

individual first means associated with each pair of adjacent dual-gate FETS in said chain, each individual first means including an amplifier having an input coupled to said second gate of a first dual-gate FET in that pair with which it is associated and having an output coupled to to said first gate of a second dual-gate FET in that pair with which it is associated;

second means for applying a delay-control voltage between said source and said drain of each of said dual-gate FETs in said chain; and third means for applying an RF or microwave signal as an input to said first gate of the dual-gate FET that is first in said chain to effect an RF or microwave signal that is time delayed with respect to said input in accordance with said applied delay-control voltage being derived at said second gate of the dual-gate FET that is last in said chain.

7. The apparatus defined in claim 6, wherein:
said second means applies in parallel a single delay-control voltage between said source and said drain of all of said dual-gate FETs in said chain.

8. The apparatus defined in claim 7, wherein:
said single delay-control voltage applied by said second means is continuously variable in its magnitude.

9. The apparatus defined in claim 6, wherein:
said second means applies a separate delay-control voltage between said source and said drain of each individual one of said dual-gate FETs in said chain.

10. The apparatus defined in claim 9, wherein:
each separate delay-control voltage applied by said second means is independently continuously variable in its magnitude.

11. The apparatus defined in claim 10, wherein said apparatus further comprises:

an individual weighting-factor means separately coupled to a specified one of said first and second gates of each of said dual-gate FETs in said chain for multiplying the RF or microwave signal appearing at that specified one of said first and second gates by that individual weighting-factor; and a combining network for summing the respective magnitudes of the individually-weighted RF or microwave signals;

whereby said apparatus operates as a transversal filter.

12. The apparatus defined in claim 11, wherein:
said specified one of said first and second gates is said first gate.

13. The apparatus defined in claim 11, wherein:
each individual weighting-factor means is independently continuously variable in its magnitude.

14. The apparatus defined in claim 6, wherein:
each of said individual first means further includes an RC filter bypassing the amplifier of that individual first means.

* * * * *